United States Patent
Deepak et al.

(10) Patent No.: US 7,696,611 B2
(45) Date of Patent: Apr. 13, 2010

(54) CONDUCTIVE MATERIAL COMPOSITIONS, APPARATUS, SYSTEMS, AND METHODS

(75) Inventors: James Christopher Deepak, Kingwood, TX (US); Andrew Albert Hrametz, Rosenberg, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 160 days.

(21) Appl. No.: 10/815,009

(22) Filed: Mar. 31, 2004

(65) Prior Publication Data

US 2005/0151233 A1 Jul. 14, 2005

Related U.S. Application Data

(60) Provisional application No. 60/536,114, filed on Jan. 13, 2004.

(51) Int. Cl.
*H01L 23/495* (2006.01)
(52) U.S. Cl. .................. 257/666; 257/676; 257/678
(58) Field of Classification Search ............. 257/666, 257/676, 678
See application file for complete search history.

(56) References Cited

U.S. PATENT DOCUMENTS

| | | | |
|---|---|---|---|
| 4,170,472 A | 10/1979 | Olsen et al. | |
| 4,524,241 A | 6/1985 | Binder et al. | |
| 4,852,401 A | 8/1989 | Hrametz et al. | 73/152.35 |
| 5,536,908 A | 7/1996 | Etchells et al. | 174/257 |
| 5,650,661 A | 7/1997 | Mathew | |
| 5,934,374 A | 8/1999 | Hrametz et al. | 166/264 |
| 6,066,402 A | 5/2000 | McAndrew | 428/457 |
| 6,095,404 A | 8/2000 | McAndrew | 228/180.1 |
| 6,301,959 B1 | 10/2001 | Hrametz et al. | 73/152.23 |
| 6,453,239 B1 | 9/2002 | Shirasaka et al. | 701/220 |
| 2003/0037959 A1* | 2/2003 | Master et al. | 174/256 |

FOREIGN PATENT DOCUMENTS

| | | |
|---|---|---|
| EP | 0507718 A1 | 10/1992 |
| JP | 59-085395 | 5/1984 |
| JP | 04-327396 | 11/1992 |
| JP | 09-308961 | 12/1997 |
| JP | 11-195740 A | 7/1999 |

(Continued)

OTHER PUBLICATIONS

Burling, S. , "Pre-Plated Palladium Lead Frames Vs Spot Selective Silver And Tin-Lead", *Transactions of The Institute of Metal Finishing*, 76(2), XP000751326,(Mar. 1998),B23-B25.

(Continued)

*Primary Examiner*—Long Pham
(74) *Attorney, Agent, or Firm*—Schwegman, Lundberg & Woessner, P.A.

(57) ABSTRACT

Various apparatus and systems, as well as methods and articles, may include the use of several compositions, such as solder formulations, including about 78%-83% by weight of lead, about 9%-11% by weight of antimony, about 1%-3% by weight of silver, and a balance of tin. Some embodiments include a process of removing a previously-existing lead finish, and applying a new finish to the lead to improve solder operation compatibility, as well as solder joint reliability in high temperature environments.

18 Claims, 4 Drawing Sheets

FOREIGN PATENT DOCUMENTS

| WO | WO-8203294 A1 | 9/1982 |
| WO | WO-8704008 A1 | 7/1987 |
| WO | WO-2005071750 A2 | 8/2005 |

OTHER PUBLICATIONS

"Invitation to Pay Additional Fees, Application No. PCT/US2005/000599, date mailed Jun. 10, 2006", 6 Pages.

Hwang, Jennie S., "Modern Solder Technology for Competitive Electronics Manufacturing", (1996),pp. 1-121.

Manko, Howard H., "Solders and Soldering", 4th Edition,(2001),pp. 1-167.

Chinese Patent Application No. 200580007810.9, First Office Action (w/ English translation) mailed Jan. 19, 2008, 33 pgs.

International Application No. PCT/US2005/000599, International Search Report mailed Nov. 17, 2005, 5 pgs.

International Application No. PCT/US2005/000599, Written Opinion mailed Nov. 17, 2005, 10 pgs.

"Chinese Patent Application No. 200580007810.9, Response filed Aug. 1, 2008 to First Office Action mailed Jan. 18, 2008", 4 pgs.

"Canandian Application No. 2,553,438 Office Action Mailed Dec. 2, 2008", 3 pgs.

"Chinese Application No. 200580007810.9, Second Office Action mailed Sep. 12, 2008", 10 pgs.

"Singapore Application Serial No. 200604728-6, Response to Written Opinion filed Nov. 10, 2008", 7 pgs.

"European Application Serial No. 05705317.5, Communication mailed Dec. 19, 2006", 3 pgs.

"European Application Serial No. 05705317.5, Office Action mailed Sep. 1, 2008", 5 pgs.

"European Application Serial No. 05705317.5, Response filed Jun. 29, 2007 to Communication mailed Dec. 19, 2006", 14 pgs.

"Singapore Application Serial No. 200604728-6, Office Action mailed Jun. 11, 2008", OAR-5Mo, 10.

\* cited by examiner

CONDUCTIVE MATERIAL COMPOSITIONS, APPARATUS, SYSTEMS, AND METHODS

PRIORITY CLAIM

This application claims the benefit of priority under 35 U.S.C. §119(e) to U.S. Provisional Patent Application Ser. No. 60/536,114, titled "Lead-Free Solder Improvements for Attachment of Surface Mount Components in a High Temperature", filed on Jan. 13, 2004, which is incorporated herein by reference in its entirety.

TECHNICAL FIELD

Various embodiments described herein relate to electrically conductive materials generally, including compositions, apparatus, systems, and methods related to electrically conductive materials that can be used to couple electronic circuitry and components to each other, including coatings, solders, component leads, conductive epoxies, and silicones

BACKGROUND INFORMATION

Electrically conductive materials, such as coatings, solders, and component leads may be used to couple electronic circuits and components to each other, with or without intervening elements, such as circuit board traces, wires, etc. In some environments, solder formulation, and the processes used to apply it, may become quite important. For example, mechanical and/or electrical performance may be affected, and regulations can prevent the use of certain component materials.

Specific challenges may arise in the areas of lead-based solder use and the application of compatible component lead finishes, especially at elevated temperatures. Thus, there is a significant need in the art to provide improved compositions, apparatus, systems, and methods for use in high-temperature environments, and/or for use in those locations where lead as a solder component is prohibited.

DETAILED DESCRIPTION

Figure 1:
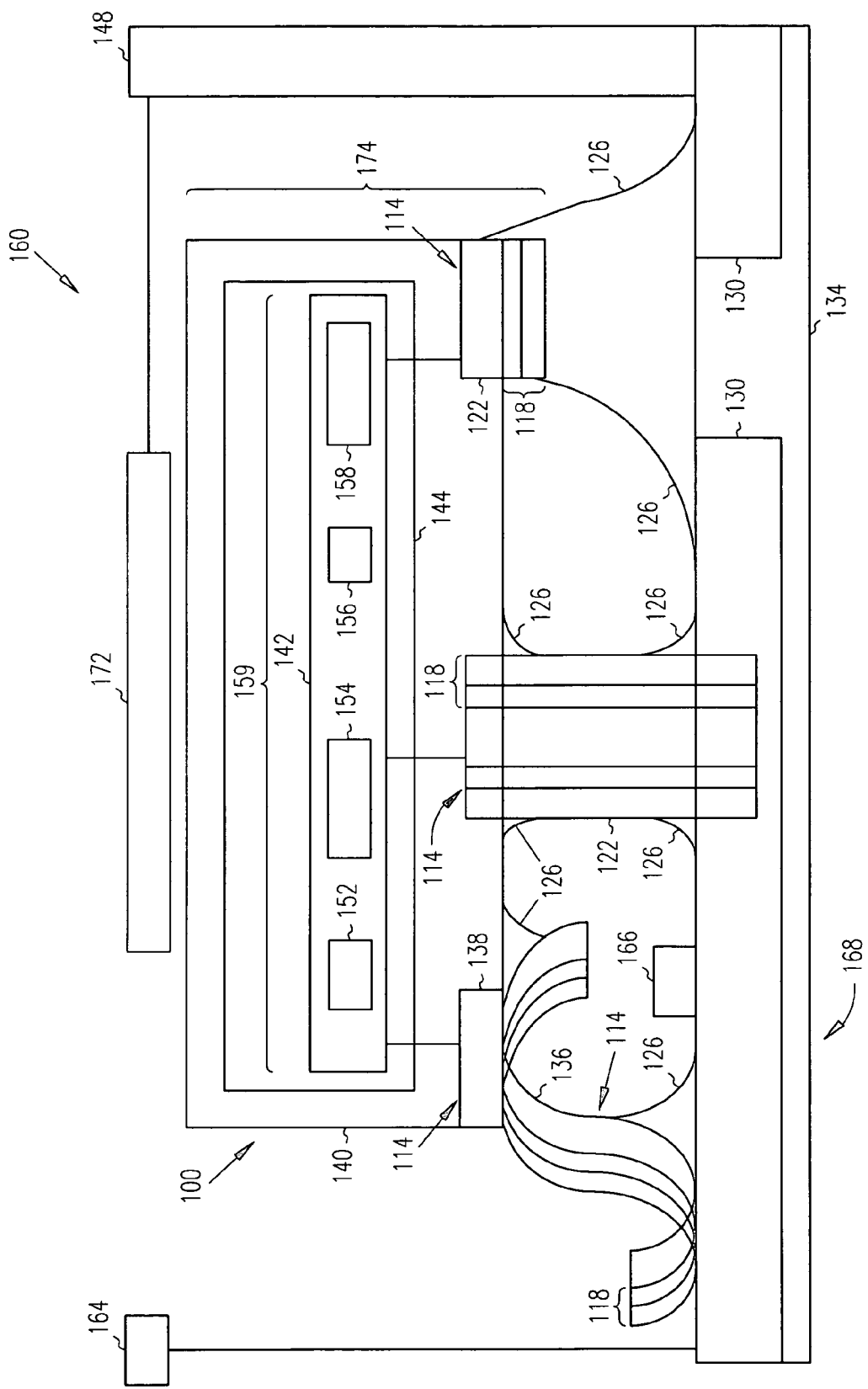
FIG. 1 is a block diagram of compositions, leads, structures, circuit boards, assemblies, and systems according to various embodiments.

Solder may perform both electrical and mechanical functions in attaching electrical components including surface mount components to printed circuit boards. Such high temperature solders used in the manufacture of electronic instrumentation for high temperature environments (e.g., downhole drilling and logging operations) may undergo thermal aging, thermal cycling, and vibration for extended periods of time in operating environments having temperatures of operation, for example, in excess of 175° C.

Various embodiments disclosed herein address some of the challenges described above by providing new solder formulations, as well as processes for their application. When the solders and processes discussed below are used, associated leads, structures, circuit boards, assemblies, and systems may operate with increased reliability in high-temperature environments, as well as in locations where the use of lead as a solder component may not be permitted.

Many embodiments relate to compositions, such as solders, and their formulations, applied to and associated with leads, package structures, circuits, circuit boards, assemblies, and systems. Some embodiments relate to processes and applications for removing incompatible component lead finishes of electronic components, such as surface mount components, and replacing them with a lead finish that may be compatible with compositions such as high temperature solders used in the manufacture of electronic oil well logging devices. Some embodiments relate to the process and application of a lead-free solder alloy used for the manufacture and assembly of high temperature electronic instrumentation.

To provide greater functional reliability under such conditions, a component's lead finish may be revised for compatibility with the solder and solder process used in the manufacturing of electronic assemblies for high temperature, high vibration, environments. Such embodiments may be used to compensate for the as-manufactured lead finish found on many components, which may be designed for use with lead-free solder or low temperature tin/lead solders.

For example, if the disclosed embodiments are not utilized during the soldering process, incompatible lead finishes may melt and join with the solder in the solder connection, producing a new alloy that can melt at a lower temperature than the leadframe coating or the solder used in making the connection. Such solder alloys may also be sensitive to small amounts of contamination which can reduce the mechanical strength and change the fatigue properties of the solder joint.

Therefore, some embodiments provide a process to remove the as-manufactured lead finish on leads, and then to attach a new lead finish composition to the leads. Such a composition may include about 85% to 98% by weight of lead, from about 0%, 0.5%, or 1%, up to about 4%, or up to about 12% by weight of silver, and a balance of tin. Some embodiments provide a composition having about 80% to 82.9% or 83% by weight of lead, about 9% to 11% by weight of antimony, about 1% to 3% by weight of silver, and the balance of tin. Some embodiments may comprise from about 0%-4% by weight of silver. In some embodiments, the composition may have about 78%-82.9% by weight of lead. In some embodiments, the composition may have about 83%-87% by weight of lead, about 9%-11% by weight of antimony, about 1%-3% by weight of silver, and a balance of tin Such embodiments may provide a suitable solderable surface for the attachment of surface mount components to printed circuit boards with high temperature alloys used in the manufacture of electronic oil well logging devices that operate in environments having temperatures greater than, for example, about 175° C.

Some embodiments provide a process to remove the as-manufactured lead finish on leads, and then to recoat the leads with a nickel barrier protected by a layer of noble metal (e.g., gold, silver, palladium, etc.). Such embodiments may also provide a suitable solderable surface for the attachment of surface mount components to printed circuit boards with high temperature alloys used in the manufacture of electronic oil well logging devices that operate in environments having temperatures greater than, for example, about 175° C.

Some embodiments may include removing an as-manufactured finish from the surface of a lead (the as-manufactured finish may include lead, or may be lead-free), and then coating the surface of the lead with a lead-free solder that may further be used as an element to couple the coated lead surface to a circuit component, such as another lead, a downhole sensor, and/or a circuit board. Prior to the application of the lead-free solder coating, a nickel barrier, perhaps protected by a layer of noble metal (e.g., gold, silver, palladium, etc.), may be applied to the surface of the lead.

For the purposes of this document, a "lead" or "component lead" is an electrically conductive element that may form an integrated part of a circuit package (e.g., the leads on a SOIC (small outline integrated circuit) package, the contacts on a so-called leadless circuit package (such as the under-bump metallization of a ball grid array package, the pads on a quad-flatpack, no-lead package, or the contacts on a LCCC (leadless ceramic chip carrier), etc.), or a physically separate lead which is coupled to a package (e.g., aftermarket S-bend leads that can be attached to a leadless chip carrier package). A "lead finish" is surface finish applied to a lead by coating, plating, or some other mechanism.

FIG. 1 is a block diagram of compositions, leads, structures, circuit boards, assemblies, and systems according to various embodiments, and capable of operating as described above. In this case a generalized concept of several embodiments may be seen, wherein a package structure 100 may include one or more leads 114 having a lead finish 118 including about 80%-98% by weight of lead, about 1%-12% by weight of silver, and tin. Some embodiments may comprise from about 0%-4% by weight of silver. The lead finish 118 may be attached to the leads 114 after a previously-existing lead finish including tin is removed.

Many formulations of the lead finish 118 are possible. For example, the lead finish 118 may include about 85%-98% by weight of lead, about 1%-12% by weight of silver, and a balance of tin. Some embodiments may comprise from about 0%-4% by weight of silver. In another embodiment, the lead finish 118 may include about 80%-83% by weight of lead, about 1%-3% by weight of silver, about 9%-11% by weight of antimony, and a balance of tin. Some embodiments may comprise from about 0%-4% by weight of silver. In some embodiments, the lead finish may include about 78%-82.9% by weight of lead. In some embodiments, the lead finish may include about 83%-87% by weight of lead, about 9%-11% by weight of antimony, about 1%-3% by weight of silver, and a balance of tin. Some embodiments may comprise from about 0%-4% by weight of silver.

In some embodiments, the leads 114 may form an integral part of the package structure 100, such as when the lead 122 forms a portion of package structure 100 comprising a surface mount component package. In this case, a composition 126, such as solder, may be used to couple the lead 122 to a trace 130 on a circuit board 134. In some embodiments, the leads 114 may be coupled to the package structure 100. For example, this may occur when aftermarket leads, such as an S-bend lead form 136, are used to couple a pad 138 on the package structure 100 to a trace 130 on a circuit board 134.

Thus, other embodiments may be realized. For example, a package structure 100 may include a package 140 (e.g., an LCCC) and a plurality of leads 114 coupled to a circuit 142 included in the package 140 and having a lead finish including about 80%-83% by weight of lead, about 1%-3% by weight of silver, about 9%-11% by weight of antimony, and a balance of tin. Some embodiments may comprise from about 0%-4% by weight of silver. In some embodiments, the lead finish may have about 78%-82.9% by weight of lead. In some embodiments, the lead finish may include about 83%-87% by weight of lead, about 9%-11% by weight of antimony, about 1%-3% by weight of silver, and a balance of tin. Some embodiments may comprise from about 0%-4% by weight of silver. The circuit 142 may be included in a substrate 144, such as a flip-chip substrate.

Still other embodiments may be realized. For example, a circuit board 134, perhaps included as part of a downhole electronic assembly, may include a processor 148 and a circuit 142 coupled to the processor 148. As noted previously, the circuit 142 may be included in a package structure 100 having a plurality of leads 114 with a lead finish including about 85%-98% by weight of lead, about 1%-12% by weight of silver, and in some embodiments, the balance of tin. Some embodiments may comprise from about 0%-4% by weight of silver. The circuit 142 may include any number of component elements, such as a memory 152, an analog-to-digital converter 154, a digital-to-analog converter 156, and/or an analog or digital filter 158, perhaps forming a portion of a data acquisition system 159, among others.

Other embodiments include a system 160 having one or more leads 114 attached to a lead finish including about 80%-98% by weight of lead, about 1%-12% by weight of silver, and tin (note that the lead finish 118 may be attached after a previously-existing (e.g., an as-manufactured) lead finish including tin has been removed). Some embodiments may comprise from about 0%-4% by weight of silver. The system 160 may further include a downhole transducer 164 coupled to one or more of the leads 114. In some embodiments, the lead finish 118 may be selected from a first composition including about 85%-98% by weight of lead, about 1%-12% by weight of silver, and a balance of tin, and a second composition including about 80%-83% by weight of lead, about 1%-3% by weight of silver, about 9%-11% by weight of antimony, and a balance of tin. Some embodiments may comprise from about 0%-4% by weight of silver. In some embodiments, the second composition may have about 78%-82.9% by weight of lead. In some embodiments, the second composition may have about 83%-87% by weight of lead, about 9%-11% by weight of antimony, about 1%-3% by weight of silver, and a balance of tin. Some embodiments may comprise from about 0%-4% by weight of silver.

The downhole transducer 164 may include any number of components, such as downhole temperature/pressure sensors, downhole vibration sensors, downhole accelerometers, downhole fluxgates etc. The downhole transducer 164 may measure and/or monitor parameters and conditions downhole, including the temperature and/or pressure downhole, the various characteristics of subsurface formations (such as resistivity, gamma ray intensity, porosity, acoustic properties, etc.), the characteristics of the borehole (e.g., size, diameter, shape, etc.), etc.

In another embodiment, an assembly 168 may include a circuit 142 coupled to a downhole transducer 164 using at least one of a plurality of leads 114. In some embodiments, the downhole transducer 164 may include one or more component leads 114. The assembly 168 may also include a composition 126, such as a solder, attached to one or more of the plurality of leads 114. The composition 126 may include about 65% by weight of tin, about 25% of weight of silver; and about 10% by weight of antimony. In some embodiments, the composition 126 may include about 61%-69% by weight of tin. Such compositions 126 may be especially useful for use in areas where lead is prohibited. The composition 126 may further include one or more constituents of copper, bismuth, and elements such as tellurium, nickel, cobalt, cerium, lithium, beryllium, selenium, magnesium, cadmium, and indium (perhaps to improve wetting and or refine microstructures), and/or one or more rare earth elements selected from lanthanum, cerium, praseodymium, neodymium, promethium, samarium, europium, gadolinium, terbium, dysprosium, holmium, erbium, thulium, ytterbium, titanium, vanadium, zirconium, chromium, and lutetium. The assembly 168 may include any number of circuits 172, including downhole circuits.

In some embodiments, the assembly 168 may include a circuit board 134 having one or more electronic components 174 coupled to one or more downhole transducers 164. The assembly 168 may include a composition 126 attached to one or more traces 130 included in the circuit board 134. The composition 126 may include about 83%-87% by weight of lead, about 8%-12% by weight of antimony, and the balance of tin. Thus, the composition 126 may have a flow temperature range of about 230° C. to about 260° C. (and in some embodiments, a flow temperature range of about 245° C. to about 255° C., or about 245° C. to about 250° C.), and a solid temperature range of less than about 20° C. to about 200° C. (and in some embodiments, of less than about 20° C. to about 230° C., or about 245° C.). The assembly 168 may include circuits 172, including downhole circuits, such as a transceiver, a transmitter, and/or a receiver capable of being communicatively coupled to the electronic components 174. In some embodiments, the composition 126 may have about 83%-87% by weight of lead, about 9%-11% by weight of antimony, about 1%-3% by weight of silver, and a balance of tin. Some embodiments may comprise from about 0%-4% by weight of silver.

As noted previously, many formulations may be used to make up the composition 126. Thus, the composition may be formulated to include about 78%-83% by weight of lead, about 9%-11% by weight of antimony, about 1%-3% by weight of silver, and a balance of tin. Some embodiments may comprise from about 0%-4% by weight of silver. In some embodiments, the composition may have about 78%-82.9% by weight of lead. The composition 126 may also further include one or more constituents of copper, antimony, bismuth, indium, and/or one or more rare earth elements selected from lanthanum, cerium, praseodymium, neodymium, promethium, samarium, europium, gadolinium, terbium, dysprosium, holmium, erbium, thulium, ytterbium, titanium, vanadium, zirconium, chromium, and lutetium. In some embodiments, the composition 126 may have a flow temperature range of about 230° C. to about 245° C. (and in some embodiments about 230° C. to about 240° C., or about 235° C. to about 240° C.), and a solid temperature range of less than about 20° C. to about 200° C. (and in some embodiments, of less than about 20° C. to about 230° C., or about 235° C.).

It should also be understood that the compositions, leads, structures, circuit boards, assemblies, and systems of various embodiments can be used in applications other than downhole environments, including well logging and drilling applications, and thus, the embodiments shown are not to be so limited. The illustrations of compositions 126, leads 114, package structures 100, assemblies 168, and systems 160 are intended to provide a general understanding of the elements and structure of various embodiments, and they are not intended to serve as a complete description of all the features of compositions, leads, structures, circuit boards, assemblies, and systems that might make use of the elements and structures described herein.

Applications that may include the novel compositions, leads, structures, circuit boards, assemblies, and systems of various embodiments include electronic circuitry used in high-speed computers, communication and signal processing circuitry, data transceivers, modems, processor modules, embedded processors, and application-specific modules, including multilayer, multi-chip modules. Such compositions, leads, structures, circuit boards, assemblies, and systems may further be included as sub-components within a variety of electronic systems, such as televisions, cameras, cellular telephones, personal computers, workstations, radios, video players, vehicles, and others.

The package structure 100, leads 114, lead finish 118, lead 122, compositions 126, traces 130, circuit board 134, S-bend lead form 136, pad 138, circuit 142, substrate 144, processor 148, memory 152, analog-to-digital converter 154, digital-to-analog converter 156, analog or digital filter 158, data acquisition system 159, system 160, downhole transducer 164, circuit 166, assembly 168, circuits 172, and electronic components 174 may all be characterized as "modules" herein. Such modules may include hardware circuitry, and/or a processor and/or memory circuits, software program modules and objects, and/or firmware, and combinations thereof, as desired by the designer.

It should also be understood that the apparatus and systems of various embodiments can be used in applications other than for downhole drilling and wireline logging operations, and thus, various embodiments are not to be so limited. The illustrations of leads 114, compositions 126, circuit boards 134, systems 160, and assemblies 168 are intended to provide a general understanding of the structure of various embodiments, and they are not intended to serve as a complete description of all the elements and features of apparatus and systems that might make use of the structures described herein.

Many lead finish techniques may be employed in the semiconductor industry. Two of these include plating and coating. Further, at least two types of plating may be used, i.e., pure metal plating such as tin plating, and alloy plating, such as tin/lead plating.

Coating can be a process of depositing a filler (e.g., solder) over a surface, achieving metallurgical bonding through surface wetting. In some embodiments, the process is classified as coating when the filler has a melting temperature below about 315° C. Surface tension may play an important part in the coating process, such that wetting of the surface to be coated by the filler is achieved. A diffusion layer may then grow at the surface-filler interface as filler spreads through the surface during the coating process.

Tin plating may be a form of pure metal electroplating, which can be a process of depositing a coating of metal on a surface by passing a current through a conductive medium, or electrolyte. An electroplating system may thus have four components: 1) a cathode, which may serve as the surface to be coated; 2) an anode, which may serve as the source of coating metal; 3) an electrolyte, which is the aqueous medium through which the metal ions from the anode may transfer to the cathode; and 4) a power source, which may supply the current or energy used in the plating process.

Figure 2:
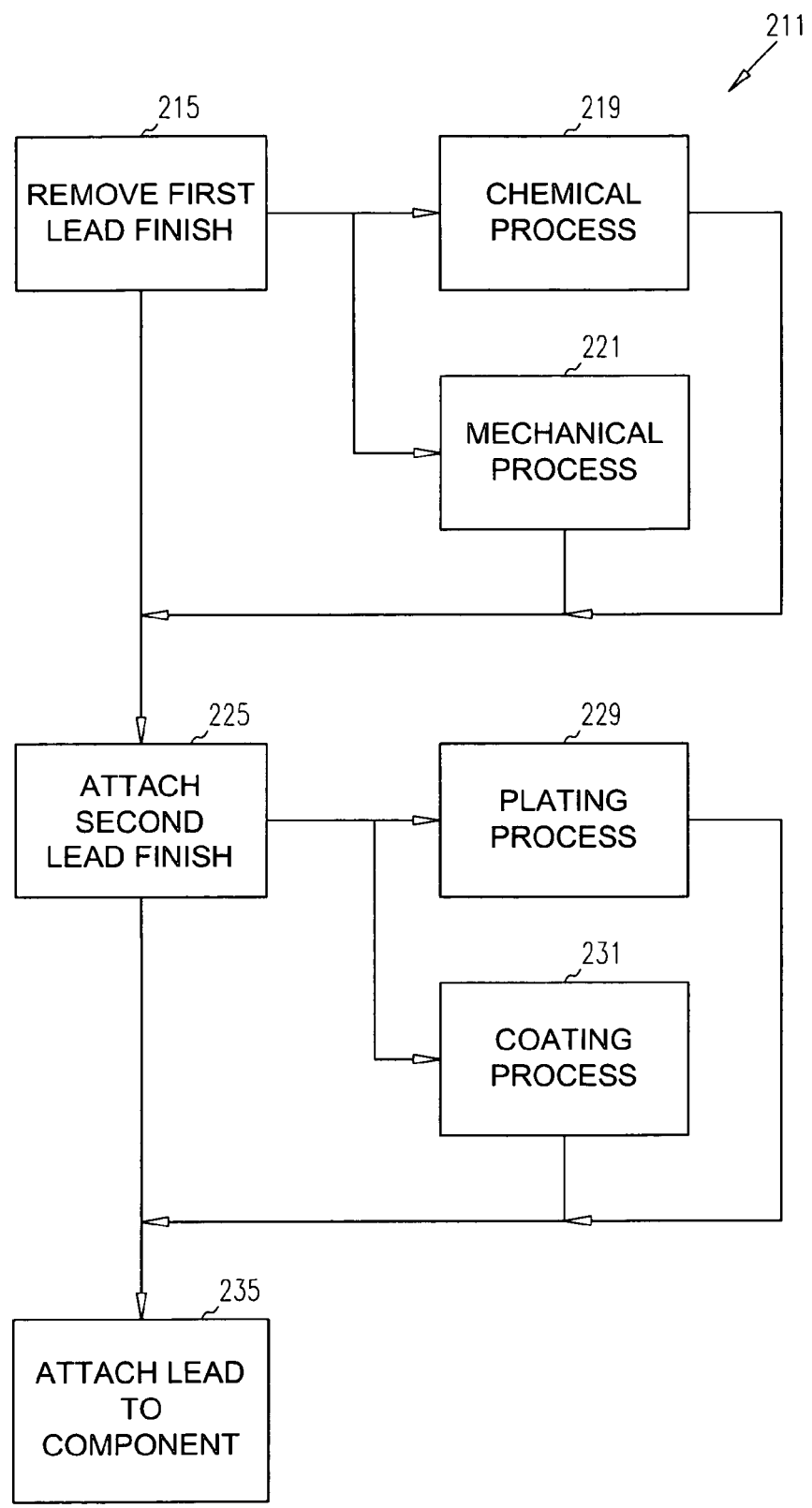
FIG. 2 is a flow chart illustrating several methods according to various embodiments.

FIG. 2 is a flow chart illustrating several methods 211 according to various embodiments. For example, a method 211 may (optionally) include removing a first lead finish from a surface of a component lead prior to attaching a composition to the lead at block 215. Removing the first lead finish may in turn include removing the first lead finish using a chemical process at block 219. Alternatively, or in addition, removing the first lead finish may include removing the first lead finish using a mechanical process at block 221.

The method 211 may include attaching a composition that includes about 85%-98% by weight of lead, about 1%-12% by weight of silver, and the balance of tin as a second lead finish to the surface of the component lead at block 225. Some embodiments may comprise attaching a composition that includes about 0%-4% by weight of silver. Some embodiments may include attaching a composition that comprises about 80%-98% by weight of lead, about 0%-4% by weight of silver, and tin, including the balance of tin. Attaching the composition may include attaching the composition using a plating process at block 229. Alternatively, or in addition, attaching the composition may further include attaching the composition using a coating process at block 231. The method 211 may conclude with attaching the component lead to an electronic component at block 235 if the lead does not already form an integral part of a package structure, for example.

Lead finishes to be applied may include those with a nickel barrier over a copper lead frame. In some embodiments, appropriate high temperature finishes may include NiPd, NiAuPd, NiSn, NiAg, and electrolysis Ni/immersion Au. In some embodiments, a process may strip off the original or as-manufactured lead finish and recoat with one of the high temperature finishes, such as NiPd, NiAuPd, NiSn, NiAg, electrolysis Ni/immersion Au.

Thus, in some embodiments, a method 211 may include removing a first lead finish from a surface of a lead at block 215 and attaching a composition that includes nickel and a noble metal as a second lead finish to the surface at block 225. Removing the first lead finish at block 215 may include using a process selected from a chemical process at block 219, and/or a mechanical process at block 221. Attaching the composition at block 225 may include using at least one process selected from a plating process (e.g., an electrolysis process) at block 229, and a coating process (e.g., an immersion process) at block 231.

It should be noted that the methods described herein do not have to be executed in the order described, or in any particular order. Moreover, various activities described with respect to the methods identified herein can be executed in serial or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute, for example, the method described in FIG. 2. One of ordinary skill in the art will further understand the various programming languages that may be employed to create one or more software programs designed to implement and perform the methods disclosed herein. The programs may be structured in an object-orientated format using an object-oriented language such as Java, Smalltalk, or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment, including Hypertext Markup Language (HTML) and Extensible Markup Language (XML). Thus, other embodiments may be realized, such as software modules, data processing hardware, data processing system-implemented methods, and various processing operations, further described herein.

Figure 3:
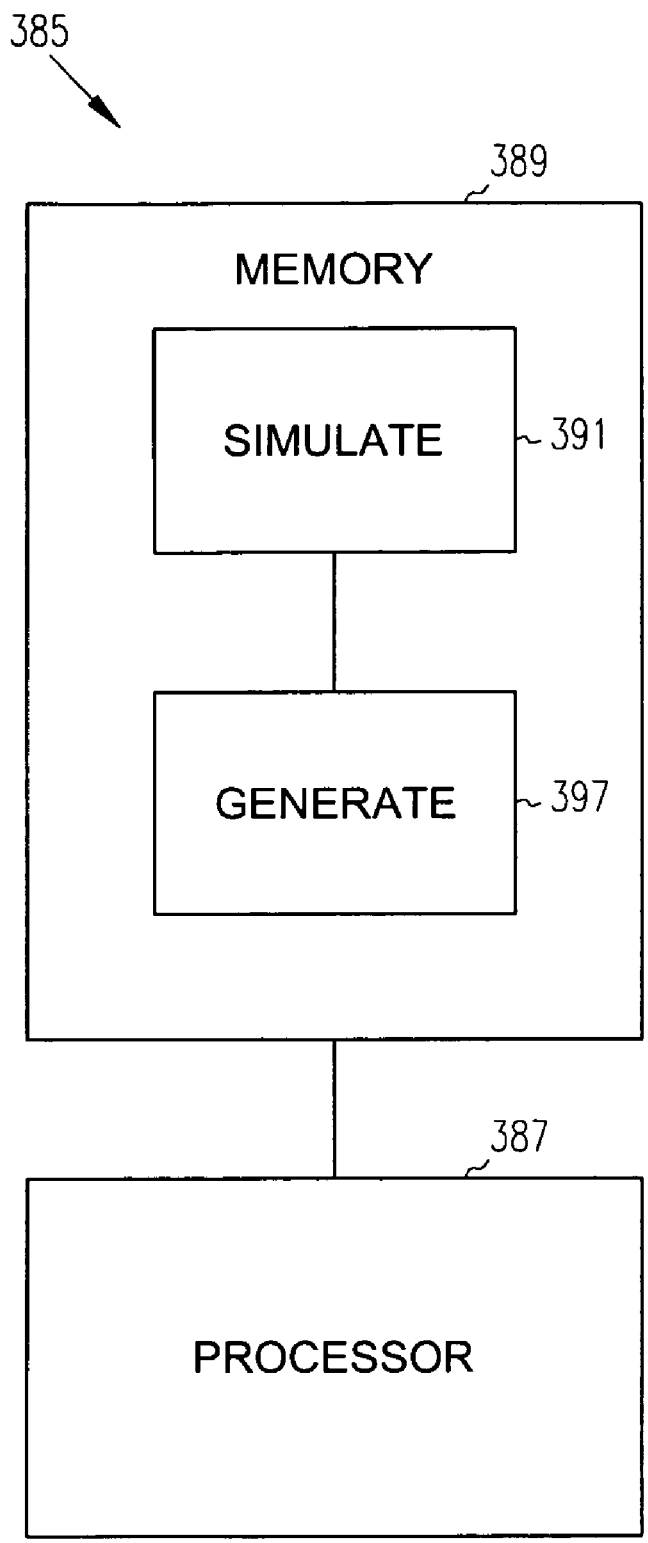
FIG. 3 is a block diagram of an article according to various embodiments.

FIG. 3 is a block diagram of an article 385 according to various embodiments, such as a computer, a memory system, a magnetic or optical disk, some other storage device, and/or any type of electronic device or system. The article 385 may include a processor 387 coupled to a machine-accessible medium such as a memory 389 (e.g., a memory including an electrical, optical, or electromagnetic conductor) having associated information, simulate 391, generate 397 (e.g., computer program instructions and/or data), which when accessed, results in a machine (e.g., the processor 387) performing such actions, for example, as those implemented in the method of FIG. 2.

Figure 4:
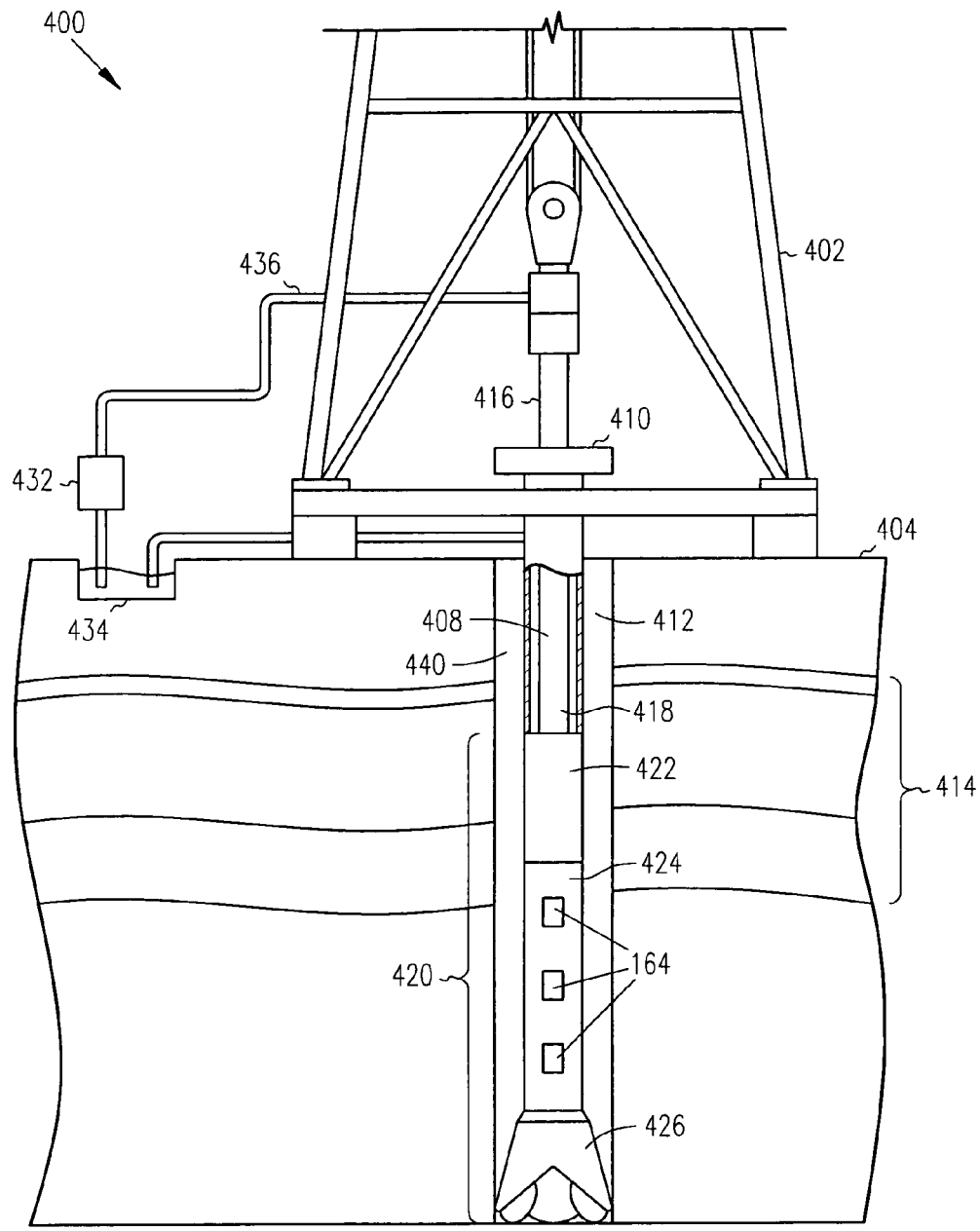
FIG. 4 illustrates a system for drilling operations according to various embodiments.

Many embodiments may be included in components (such as a downhole tool) of a downhole drilling operation. FIG. 4 illustrates a system for drilling operations according to various embodiments. A system 400 includes a drilling rig 402 located at a surface 404 of a well. The drilling rig 402 provides support for a drill string 408. The drill string 408 penetrates a rotary table 410 for drilling a borehole 412 through subsurface formations 414. The drill string 408 includes a Kelly 416 (in the upper portion), a drill pipe 418 and a bottom hole assembly 420 (located at the lower portion of the drill pipe 418).

The bottom hole assembly 420 may include drill collars 422, a downhole tool 424 and a drill bit 426. The drill bit 426 creates the borehole 412 by penetrating the surface 404 and subsurface formations 414. The downhole tool 424 may be any of a number of different types of tools including MWD tools, LWD tools, etc.

During drilling operations, the drill string 408 (including the Kelly 416, the drill pipe 418 and the bottom hole assembly 420) may be rotated by the rotary table 410. In addition or as an alternative to such rotation, the bottom hole assembly 420 may also be rotated by a motor (not shown) that is downhole. The drill collars 422 may be used to add weight to the drill bit 426. The drill collars 422 also may stiffen the bottom hole assembly 420 to allow the bottom hole assembly 420 to transfer the weight to the drill bit 426. Accordingly, this weight provided by the drill collars 422 also assists the drill bit 426 in the penetration of the surface 404 and the subsurface formations 414.

During drilling operations, a mud pump 432 may pump drilling fluid (known as "drilling mud") from a mud pit 434 through a hose 436 into the drill pipe 418 down to the drill bit 426. The drilling fluid can flow out from the drill bit 426 and returns back to the surface through an annular area 440 between the drill pipe 418 and the sides of the borehole 412. The drilling fluid may then be returned to the mud pit 434, where such fluid is filtered. Accordingly, the drilling fluid can cool the drill bit 426 as well as provide for lubrication of the drill bit 426 during the drilling operation. Additionally, the drilling fluid removes the cuttings of the subsurface formations 414 created by the drill bit 426.

The downhole tool 424 may include one or more leads 114, compositions 126, circuit boards 134, systems 160, downhole transducers 164, and assemblies 168 (see FIG. 1), to assist in monitoring various downhole parameters and, optionally, generating data to be stored in one or more storage media, perhaps also located within the downhole tool 424 (e.g., similar to or identical to a memory 152, see FIG. 1). The type of downhole tool 424 and the type of downhole transducers 164 mounted thereon may be dependent on the type of downhole parameters being measured. Such parameters may include the downhole temperature and pressure downhole, the various characteristics of the earth formations (such as resistivity, water saturation, density, porosity, etc.), the characteristics of the borehole (e.g., size, shape, etc.), etc. Thus, the downhole tool 424 and other components the drill string 408 may include compositions, leads, structures, circuit boards, assemblies, and systems according to various embodiments described herein.

Using various embodiments of the invention may improve the manufacturability, reliability and service life of leads and electronic assemblies having unique compositions, including solder formulations, applied. In some embodiments, these compositions may provide more reliable use of various electronic components in high temperature environments (e.g., downhole drilling). In some embodiments, recoating the leads of electronic components with a high temperature lead finish that is compatible with high temperature solders will also permit use in high temperature environments (e.g., electronic oil well logging devices), and may operate to prevent contamination of the associated solder joints.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A component lead comprising:
a lead finish comprising from about 78% to less than 80% by weight of lead, between about 9% and about 11% by weight of antimony, greater than 5% up to about 12% by weight of silver, and a balance of tin disposed over the component lead.

2. The component lead of claim 1, wherein the component lead is to be coupled to a lead of a surface mount component.

3. The component lead of claim 1, wherein the component lead is coupled to a downhole electronic assembly.

4. A package structure comprising:
a package; and
a plurality of component leads coupled to a circuit included in the package and having a lead finish comprising from about 78% to less than 80% by weight of lead, between about 9% and about 11% by weight of antimony, greater than 5% up to about 12% by weight of silver, and a balance of tin.

5. The package structure of claim 4, wherein the circuit is included in a substrate.

6. The package structure of claim 5, wherein the package structure is part of a downhole electronic assembly.

7. A circuit board, comprising:
a processor; and
a circuit coupled to the processor and included in a package structure having a plurality component leads having a lead finish comprising from about 78% to less than 80% by weight of lead, between about 9% and about 11% by weight of antimony, greater than 5% up to about 12% by weight of silver, and a balance of tin.

8. The circuit board of claim 7, wherein the circuit includes a memory.

9. The circuit board of claim 7, wherein the circuit includes a digital-to-analog converter.

10. A system comprising:
a component lead having a lead finish disposed over the component lead, the lead finish comprising from about 78% to less than 80% by weight of lead, between about 9% and about 11% by weight of antimony, greater than 5% up to about 12% by weight of silver, and a balance of tin; and
a downhole transducer coupled to the component lead.

11. The system of claim 10, wherein the downhole transducer is selected from the group consisting of a downhole temperature indicator, a downhole vibration sensor, a pressure sensor, an accelerometer, and a fluxgate.

12. The system of claim 10, wherein the downhole transducer is to measure a subsurface characteristic that is selected from a group consisting of a downhole temperature, a downhole pressure, a resistivity of a subsurface formation, a porosity of a subsurface formation, a diameter of a borehole, and a shape of the borehole.

13. The system of claim 10, further comprising:
a processor coupled to the component lead.

14. The system of claim 10, further comprising:
an amplifier coupled to the component lead.

15. An assembly comprising:
a downhole transducer coupled to a circuit trace included in a circuit attached to a composition including a first amount from about 78% to less than 80% by weight of lead, a second amount between about 9% and about 11% by weight of antimony, a third amount greater than 5% up to about 12% by weight of silver, and a balance of tin.

16. The assembly of claim 15, further comprising:
a processor to be communicatively coupled to the circuit.

17. The assembly of claim 15, wherein the circuit includes a data acquisition system.

18. The assembly of claim 15, wherein the circuit includes a filter.

* * * * *